(12) United States Patent
Yun et al.

(10) Patent No.: US 7,402,483 B2
(45) Date of Patent: Jul. 22, 2008

(54) METHODS OF FORMING A MULTI-BRIDGE-CHANNEL MOSFET

(75) Inventors: Eun-jung Yun, Seoul (KR); Sung-min Kim, Incheon Metropolian (KR); Sung-young Lee, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 371 days.

(21) Appl. No.: 11/190,695

(22) Filed: Jul. 26, 2005

(65) Prior Publication Data

US 2006/0024874 A1     Feb. 2, 2006

(30) Foreign Application Priority Data

Jul. 30, 2004     (KR) ..................... 10-2004-0060101

(51) Int. Cl.
*H01L 21/8238*     (2006.01)
(52) U.S. Cl. ................ 438/206; 438/282; 438/201; 438/197; 438/209
(58) Field of Classification Search .............. 438/206, 438/201, 197
See application file for complete search history.

(56) References Cited

U.S. PATENT DOCUMENTS

| 5,372,959 | A | * | 12/1994 | Chan | ........................... | 438/157 |
| 5,744,393 | A | * | 4/1998 | Risch et al. | ................. | 438/275 |
| 5,965,914 | A | | 10/1999 | Miyamoto | .................. | 257/331 |
| 6,498,359 | B2 | | 12/2002 | Schmidt et al. | ............. | 257/190 |
| 2004/0063286 | A1 | * | 4/2004 | Kim et al. | ................... | 438/283 |

(Continued)

FOREIGN PATENT DOCUMENTS

KR     95002202 B1     3/1995

(Continued)

OTHER PUBLICATIONS

S. Y. Lee et al., A novel Multibridge-Channel MOSFET (MBCFET): Fabrication Technonlgies and Characteristics, IEEE Transcations on Nanotechnology, vol. 2, No. 4, Dec. 2003.*

*Primary Examiner*—Walter Benson
*Assistant Examiner*—Eva Montalvo
(74) *Attorney, Agent, or Firm*—Myers Bigel Sibley & Sajovec, P.A.

(57) ABSTRACT

A multi-bridge-channel MOSFET (MBCFET) may be formed by forming a stacked structure on a substrate that includes channel layers and interchannel layers interposed between the channel layers. Trenches are formed by selectively etching the stacked structure. The trenches run across the stacked structure parallel to each other and separate a first stacked portion including channel patterns and interchannel patterns from second stacked portions including channel and interchannel layers remaining on both sides of the first stacked portion. First source and drain regions are grown using selective epitaxial growth. The first source and drain regions fill the trenches and connect to second source and drain regions defined by the second stacked portions. Marginal sections of the interchannel patterns of the first stacked portion are selectively exposed. Through tunnels are formed by selectively removing the interchannel patterns of the first stacked portion beginning with the exposed marginal sections. The through tunnels are surrounded by the first source and drain regions and the channel patterns. A gate is formed along with a gate dielectric layer, the gate filling the through tunnels and extending onto the first stacked portion.

20 Claims, 15 Drawing Sheets

U.S. PATENT DOCUMENTS

2004/0209463 A1* 10/2004 Kim et al. .................. 438/666
2005/0112851 A1* 5/2005 Lee et al. .................. 438/497
2005/0266645 A1* 12/2005 Park .......................... 438/282
2006/0125018 A1* 6/2006 Lee et al. .................. 257/369
2006/0240622 A1* 10/2006 Lee et al. .................. 438/257
2007/0063263 A1* 3/2007 Oh et al. .................... 257/316
2007/0111532 A1* 5/2007 Lee et al. .................... 438/745

FOREIGN PATENT DOCUMENTS

KR    1020040029582 A    1/2004

* cited by examiner

METHODS OF FORMING A MULTI-BRIDGE-CHANNEL MOSFET

CROSS REFERENCE TO RELATED APPLICATION

This application claims the priority of Korean Patent Application No. 2004-60101, filed on Jul. 30, 2004, in the Korean Intellectual Property Office, the disclosure of which is hereby incorporated herein by reference in its entirety.

BACKGROUND OF THE INVENTION

1. Field of the Invention

The present invention relates to methods of forming semiconductor devices, and, more particularly, to methods of forming a multi-bridge-channel metal oxide semiconductor field effect transistor (MBCFET).

2. Description of the Related Art

As the integration density of semiconductor memory devices has increased, the area of an active region where elements are disposed has gradually been scaled down. The downscaling of the active region may preclude obtaining a sufficient effective channel length or effective channel width of a transistor.

A reduction in the channel length of a transistor, such as a metal oxide semiconductor field effect transistor (MOSFET), may make a short channel effect predominant, thus adversely affecting the characteristics of the transistor. Also, as the channel width of a transistor decreases, a narrow width effect, which results in an increase of threshold voltage, may become more prominent and have a bad influence on the transistor. To overcome these drawbacks, many attempts for increasing the effective channel length (or width) of a transistor within a restricted active region have been made.

For example, a multi-bridge-channel FET (MBCFET) was presented. The MBCFET includes a plurality of rectangular thin channels and a gate surrounding the top, bottom, and side surfaces of the channels, and the channels are vertically stacked. The gate disposed on the channels includes branch layers that extend between the channels. The branch layers of the gate are connected to each other on two opposite lateral portions of the channels.

A typical MBCFET has the above-described structure, but a process of manufacturing the MBCFET may include some problems. For example, to operate an MBCFET, source and drain regions are connected to channels. However, when a stacked structure including the channels and a gate and/or branch layers is formed, a top of the source and drain regions is disposed in an even lower position than a top layer of the gate, thus leaving a step difference therebetween.

FIG. 1 is a cross-sectional view of a conventional MBCFET structure. Referring to FIG. 1, the conventional MBCFET includes a plurality of rectangular thin channels 11 disposed on a substrate 10, a gate 30 surrounding the top and bottom surfaces and/or the front and rear surfaces of the channels 11, and branch layers 31 of the gate 30. Gate dielectric layers 20 are disposed between the gate 30 (and/or the branch layers 31) and the channels 11.

The channels 11 are electrically connected to source and drain regions 15. When the channels 11 and the gate 30 (and/or the branch layers 31) are stacked, the source and drain regions 15 are disposed in a much lower position than a top layer of the gate 30. To overcome this step difference and electrically connect the source and drain regions 15 and the channels 11, a connection layer 13 is formed in the form of spacers on the sidewalls of the stacked structure including the channels 11 and the branch layers 31.

Thus, charges are transported between a contact position 17 on the source and drain regions 15 and the top layer of the gate 30 through the connection layer 13 that electrically connects the source and drain regions 15 and the channels 11. In this case, a charge transfer distance is greatly extended so that resistances to the source and drain regions 15 are undesirably increased.

Also, if the substrate 10 is a silicon on insulator (SOI) substrate, to realize a thin body of the SOI substrate, a silicon layer may be formed to a thickness of about 30 nm or less on a buried oxide layer or a bottom oxide layer (BOX). In this case, the buried oxide layer or the BOX may be exposed because an over etch margin is insufficient in an etch process for forming a path required for forming the branch layers 31. The exposure of the buried oxide layer or the BOX may preclude performing selective epitaxial growth (SEG). Accordingly, it may become difficult to form the source and drain regions 15.

Moreover, owing to the step difference between the source and drain regions 15 and the top layer of the gate 30, it may be difficult to perform a subsequent metallization, which is required to selectively form a metal electrode layer at the contact position 17 on the source and drain regions 15. This is because the step difference impedes forming insulating spacers, which are used in forming a metal layer or/a metal silicide layer selectively on the connection layer 13.

To solve these problems, a process of forming a polysilicon plug for the source and drain regions 15 on the connection layer 13 can be considered. FIG. 2 is a cross-sectional view of a conventional MOSFET including polysilicon-plug type source and drain regions 55. Referring to FIG. 2, the polysilicon-plug type source and drain regions 55 are formed on a stacked structure, which is formed on a substrate 50 and includes a plurality of rectangular thin channels 51, a gate 70, and branch layers 71 of the gate 70. The channels 51, between which the branch layers 71 and gate dielectric layers 60 are interposed, are connected to the source and drain regions 55 by a connection layer 53. In this case, the source and drain regions 55 are formed using polysilicon plugs 57 so as to reduce a step difference between the source and drain regions 55 and the gate 70.

However, the foregoing structure assists in reducing the step difference, but makes a manufacturing process complicated because the manufacturing process involves depositing and etching back a polysilicon layer. Also, corners of the channel 51 disposed under the gate 70 may be etched in the etchback process of the polysilicon layer so that upper shoulder corners 59 of the connection layer 53 have steep etched surfaces. Due to the steep etched surfaces of the connection layer 53, lightly doped drain (LDD)-type source and drain regions 55 formed in the connection layer 53 also have steep profiles. In this case, resistances of the source and drain regions 55 are undesirably increased. Further, by etching the corners of the channel 51, an etchback margin may be insufficient.

As described above, the step difference between the source and drain regions and the top layer of the gate may lead to an increase in resistance. Thus, there remains room for improvement in the art.

SUMMARY OF THE INVENTION

According to some embodiments of the present invention, a multi-bridge-channel MOSFET (MBCFET) may be formed by forming a stacked structure on a substrate that includes channel layers and interchannel layers interposed between the channel layers. Trenches are formed by selectively etching the stacked structure. The trenches run across the stacked structure parallel to each other and separate a first stacked portion including channel patterns and interchannel patterns from second stacked portions including channel and interchannel layers remaining on both sides of the first stacked portion. First source and drain regions are grown using selective epitaxial growth. The first source and drain regions fill the trenches and connect to second source and drain regions defined by the second stacked portions. Marginal sections of the interchannel patterns of the first stacked portion are selectively exposed. Through tunnels are formed by selectively removing the interchannel patterns of the first stacked portion beginning with the exposed marginal sections. The through tunnels are surrounded by the first source and drain regions and the channel patterns. A gate is formed along with a gate dielectric layer, the gate filling the through tunnels and extending onto the first stacked portion.

In other embodiments of the present invention, the substrate comprises a silicon substrate and a silicon on insulator (SOI) substrate.

In still other embodiments of the present invention, the interchannel layers comprise single crystalline semiconductor materials, respectively, having an etch selectivity with respect to each other.

In still other embodiments of the present invention, the first source and drain regions have an etch selectivity with respect to the interchannel layers.

In still other embodiments of the present invention, forming the stacked structure comprises forming the channel layers by epitaxially growing a silicon layer, forming the interchannel layers by epitaxially growing a silicon germanium layer, and forming the first source and drain regions by growing a silicon layer using selective epitaxial growth.

In still other embodiments of the present invention, the trenches are spaced apart from each other such that the first stacked portion has about a same width as a width of a portion of the gate that extends onto the first stacked portion.

In still other embodiments of the present invention, the first source and drain regions have about a same height as a top surface of the first stacked portion.

In still other embodiments of the present invention, gate spacers are formed on sidewalls of a portion of the gate that extends onto the first stacked portion. The trenches have about a same width as that of the gate spacers.

In still other embodiments of the present invention, metal silicide layer is selectively formed on portions of the gate that are exposed by the gate spacers and surfaces of the second source and drain regions.

In still other embodiments of the present invention, the gate dielectric layer is formed between the gate and the channel patterns and between the gate and the first source and drain regions.

In further embodiments of the present invention, a multi-bridge-channel FET (MBCFET) is formed by forming a stacked structure on a substrate, the stacked structure comprising channel layers and interchannel layers interposed between the channel layers. An isolation region is formed that defines the stacked structure. A dummy gate pattern is formed on the stacked structure. Dummy spacers are formed on sides of the dummy gate pattern. A first mask pattern is formed by oxidizing a surface of the stacked structure exposed by the dummy spacers. The dummy spacers are selectively removed. Trenches are formed by selectively removing exposed portions of the stacked structure using the dummy gate pattern and the first mask pattern as an etch mask. The trenches separate a first stacked portion comprising channel patterns and interchannel patterns from second stacked portions comprising channel layers and interchannel layers remaining on both sides of the first stacked portion. First source and drain regions are grown using selective epitaxial growth. The first source and drain regions fill the trenches and are connected to second source and drain regions defined by the second stacked portions. Second mask patterns are formed on sides of the dummy gate patterns. Marginal sections of the interchannel patterns of the first stacked portion are exposed by selectively removing the dummy gate pattern using the second mask pattern as an etch mask and selectively removing a portion of the isolation region that is exposed under the dummy gate pattern. Through tunnels are formed by selectively removing the interchannel patterns of the first stacked portion beginning with the exposed marginal sections. The through tunnels are surrounded by the first source and drain regions and the channel patterns. A gate is formed along with a gate dielectric layer. The gate fills the through tunnels and extends onto the first stacked portion.

In other embodiments of the present invention, the channel layers and the interchannel layers comprise single crystalline semiconductor materials, respectively, having an etch selectivity with respect to each other.

In still other embodiments of the present invention, the first source and drain regions have an etch selectivity with respect to the interchannel layers.

In still other embodiments of the present invention, forming the stacked structure comprises forming the channel layers by epitaxially growing a silicon layer, forming the interchannel layers by epitaxially growing a silicon germanium layer, and forming the first source and drain regions by growing a silicon layer using selective epitaxial growth.

In still other embodiments of the present invention, the dummy gate pattern comprises silicon oxide.

In still other embodiments of the present invention, the dummy spacers comprise silicon nitride.

In still other embodiments of the present invention, the first source and drain regions have about a same height as a top surface of the first stacked portion.

In still other embodiments of the present invention, forming the second mask patterns comprises forming a silicon nitride layer to cover the first source and drain regions and planarizing the silicon nitride layer until a top surface of the dummy gate pattern is exposed.

In still other embodiments of the present invention, the second mask patterns are selectively removed. The first mask pattern is selectively removed. Gate spacers are formed on sidewalls of a portion of the gate that extends onto the first stacked portion. A metal silicide layer is selectively formed on the portion of the gate and the second source and drain regions that are exposed by the gate spacers.

In still other embodiments of the present invention, the gate dielectric layer extends between the gate and the channel patterns of the first stacked portion and between the gate and the first source and drain regions.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
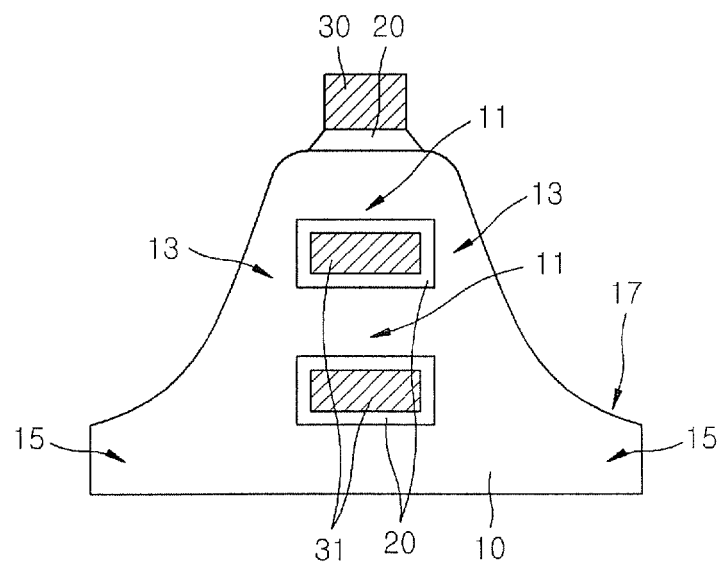
FIGS. 1 and 2 are cross-sectional views of conventional multi-bridge-channel MOSFETs (MBCFETs)
Figure 2:
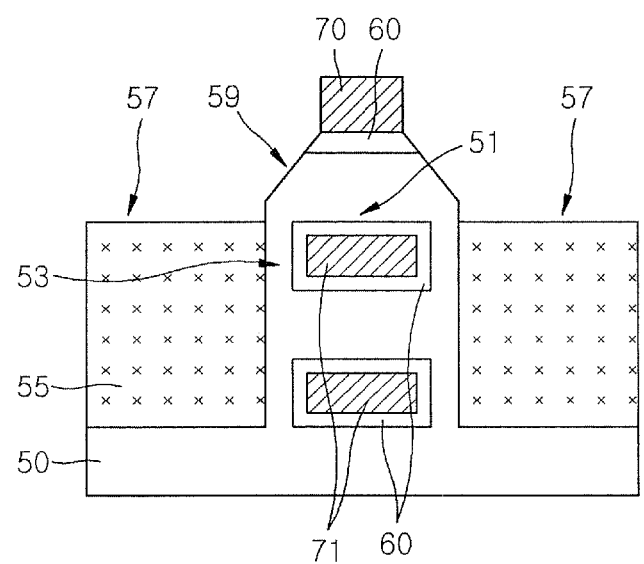

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout the description of the figures.

It will be understood that when an element is referred to as being "on" another element, it can be directly on the other element or intervening elements may be present. In contrast, when an element is referred to as being "directly on" another element, there are no intervening elements present. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another. For example, a first thin film could be termed a second thin film, and, similarly, a second thin film could be termed a first thin film without departing from the teachings of the disclosure.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the figures. It will be understood that relative terms are intended to encompass different orientations of the device in addition to the orientation depicted in the figures. For example, if the device in one of the figures is turned over, elements described as being on the "lower" side of other elements would then be oriented on "upper" sides of the other elements. The exemplary term "lower," can therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein, but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

According to some embodiments of the present invention, a multi-bridge-channel MOSFET (MBCFET) may be manufactured and/or formed to include flattened source and drain regions. The surfaces of the flattened source and drain regions may be on the same level with or on a higher level than the surface of a channel disposed directly under an uppermost gate of a stacked structure including channels and gates.

In some embodiments of the present invention, a stacked structure including Si layers and $SiGe_x$ layers is formed, and a dummy gate pattern is formed thereon. Also, dummy spacers are formed on sidewalls of the dummy gate pattern, and a first mask layer is formed as an oxide layer on surfaces of the stacked structure, which are exposed by the dummy spacers. Then, the dummy spacers are removed, portions disposed under the dummy spacers are selectively removed to form trenches for flattened source and drain regions. Thereafter, flattened source and drain layers are grown in the trenches using selective epitaxial growth (SEG).

Figure 3A:
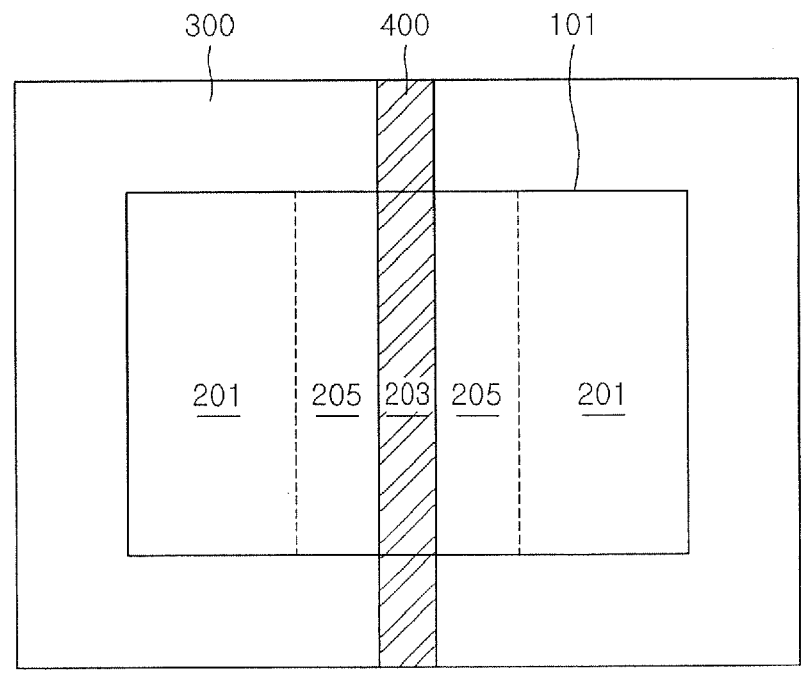
FIG. 3A is a plan view of a MBCFET according to some embodiments of the present invention.
Figure 3B:
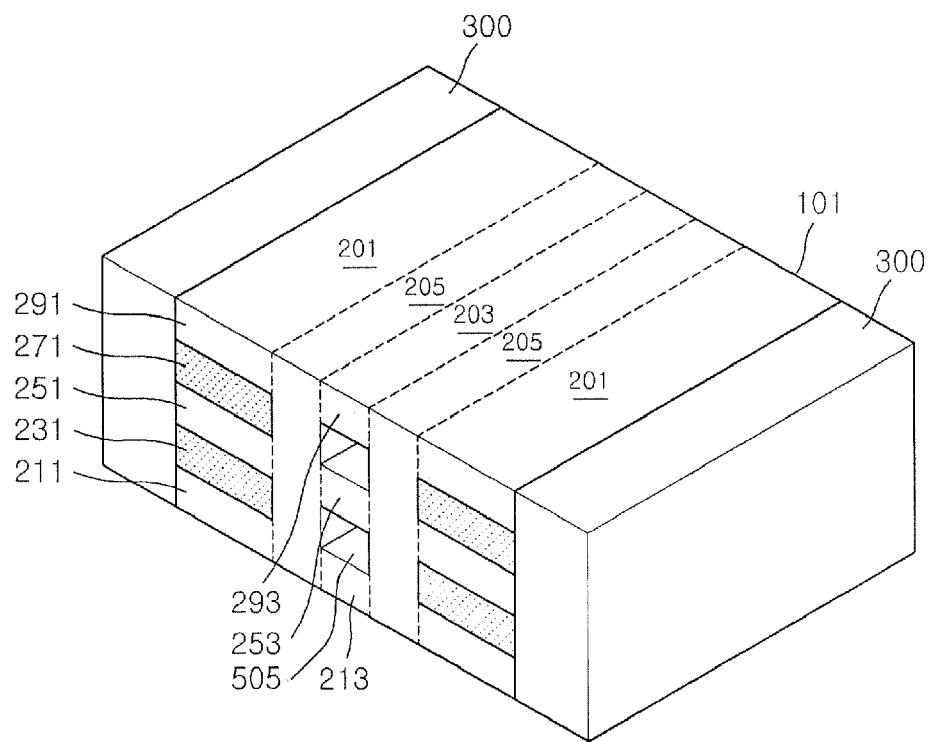
FIG. 3B is a perspective view of an active region of the MBCFET of FIG. 3A according to some embodiments of the present invention.

FIG. 3A is a plan view of an MBCFET according to some embodiments of the present invention, and FIG. 3B is a perspective view of an active region of the MBCFET. Referring to FIGS. 3A and 3B, the MBCFET, according to some embodiments of the present invention, includes a gate 400, which runs across an active region 101 defined on a substrate, first source and drain regions 205, which are disposed on both sides of the gate 400, and second source and drain regions 201, which are disposed on outer sides of the first source and drain regions 205. The active region 101 including the first source and drain regions 201 and the second source and drain regions 205 are defined by isolation regions 300.

As shown in FIG. 3B, a channel region 203 is disposed under the gate 400 in the active region 101. In the channel region 203, a plurality of channel layers 213, 253, and 293 are separated from each other by tunnels 505 and stacked. The channel layers 213, 253, and 293 are connected to each other by the first source and drain regions 205 formed on lateral surfaces, thereby completing a multi-bridge-channel structure.

The tunnels 505 are respectively filled with gate branch layers connected to the gate 400, so that the gate branch layers and the channel layers 213, 253, and 293 are alternately stacked under the gate 400. The gate 400 vertically extends along the front surface and/or rear surface of the channel region 203 shown in FIG. 3B into the tunnels 505. Thus, portions of the gate 400, which extend into the tunnels 505, can be understood as the gate branch layers. Here, gate dielectric layers, for example, silicon oxide layers, may be interposed between the gate 400 (and/or the gate branch layers) and the channel layers 213, 253, and 293.

The first source and drain regions 205 have flattened surfaces, which form substantially planar surfaces with the surface of the uppermost channel layer 293. The first source and drain regions 205 function as principal source and drain regions and are equivalent to lightly doped drain (LDD) regions of a typical transistor.

The second source and drain regions 201 can be understood as expanded source and drain regions, which are formed on the outer sides of the first source and drain regions, i.e., the LDD regions. Likewise, the second source and drain regions 201 have flattened surfaces, which form substantially planar surfaces with the surfaces of the first source and drain regions 205.

The source and drain regions 201 are formed by alternately stacking first layers 211, 251, and 291, which are equivalent to the channel layers 213, 253, and 293, respectively, and second layers 231 and 271. Because the channel layers 213, 253, and 293 may be formed of a single crystalline silicon layer, the first layers 211, 251, and 291 equivalent thereto are also formed of a single crystalline silicon layer. The second layers 231 and 271 can be understood as the remnants of layers used for forming the tunnels 505 and may be formed of $SiGe_x$ unlike the channel layers 213, 253, and 293. When an Si layer and an $SiGe_x$ layer are stacked, a strained field is formed at an interface therebetween. Such a strained field facilitates charge transfer.

Hereinafter, methods of manufacturing and/or forming a MBCFET having the above-described structure, in accordance with some embodiments of the present invention, will be described. At the outset, a stacked structure including Si layers and $SiGe_x$ layers is prepared.

Figure 4:
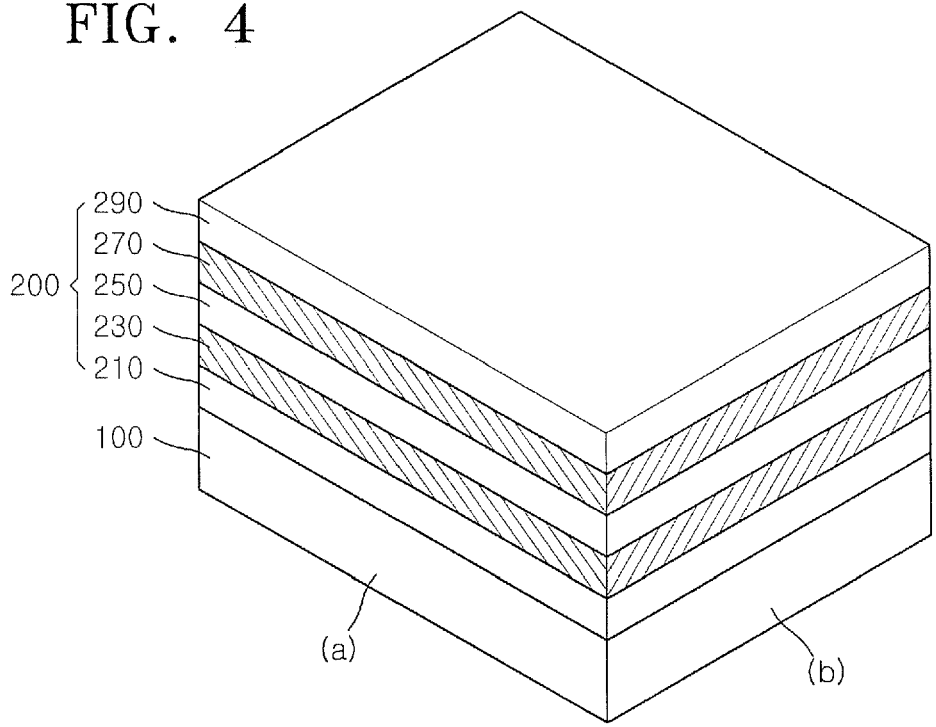
FIG. 4 is a perspective view illustrating a process of forming a stacked structure including channel layers and interchannel layers according to some embodiments of the present invention.

FIG. 4 is a perspective view illustrating a process of forming a stacked structure 200 including channel layers 210, 250, and 290 and interchannel layers 230 and 270. In FIG. 4, (a) refers to a section taken vertically to the gate 400 shown in FIG. 3A, and (b) refers to a section taken parallel to the gate 400 shown in FIG. 3A.

Referring to FIG. 4, a first channel layer 210, a first interchannel layer 230, a second channel layer 250, a second interchannel layer 270, and a third channel layer 290 are sequentially formed on a substrate 100. The number of channel layers is not limited to 3 but more than 1. The interchannel layers 230 and 270 are interposed between the channel layers 210, 250, and 290 and vertically stacked. The channel layers 210, 250, and 290 form a channel of the transistor and are formed of a single crystalline layer, for example, an Si layer, which is appropriate for the channel. The interchannel layers 230 and 270 may be formed of a semiconductor having an etch selectivity with respect to the channel layers 210, 250, and 290.

Such a stacked structure 200 may be formed using epitaxial growth. Thus, the channel layers 210, 250, and 290 may be epitaxially grown using Si, while the interchannel layers 230 and 250 may be epitaxially grown using $SiGe_x$. This is because an Si layer and an $SiGe_x$ layer have an etch selectivity with respect to each other, and the Si layer can be epitaxially grown as a single crystalline layer. Each of the channel layers 210, 250, and 290 and the interchannel layers 230 and 270 can be formed to a thickness of about 300 Å or less, and the entire stacked structure 200 can have a thickness of about 1000 to 1500 Å.

The substrate 100 may be a silicon semiconductor substrate or a silicon on insulator (SOI) substrate.

Figure 5:
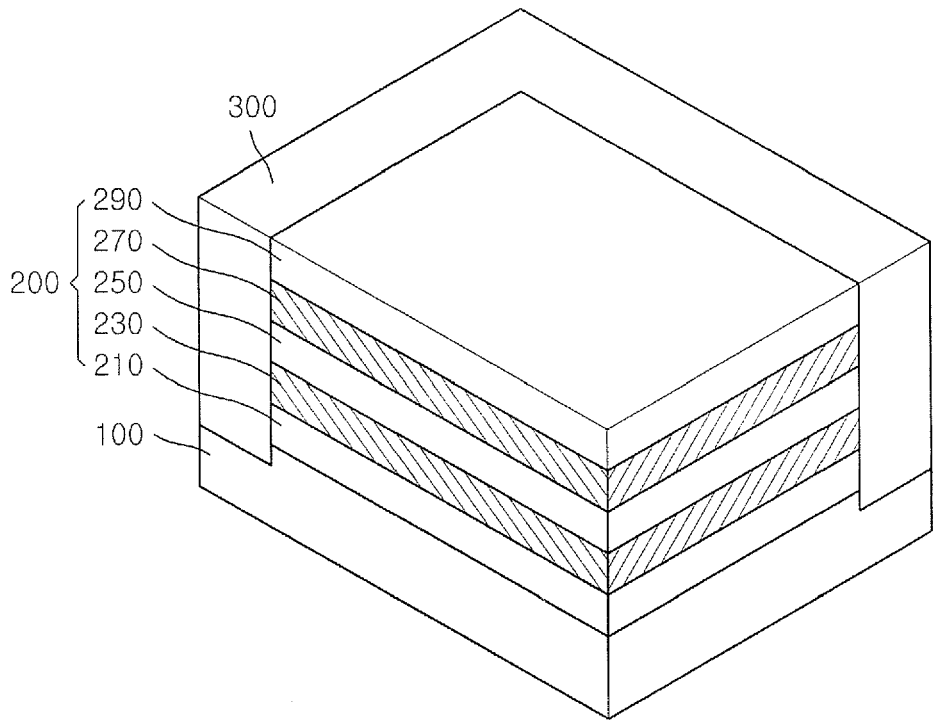
FIG. 5 is a perspective view illustrating a process of forming an isolation region according to some embodiments of the present invention.

FIG. 5 is a perspective view illustrating a process of forming the isolation regions 300.

Referring to FIG. 5, trenches are formed by patterning the stacked structure 200 including the channel layers 210, 250, and 290 and the interchannel layers 230 and 270. An insulating layer is deposited to fill the trenches, thereby forming the isolation regions 300. As shown in FIG. 3A, the active region 101 is defined by the isolation regions 300.

Figure 6:
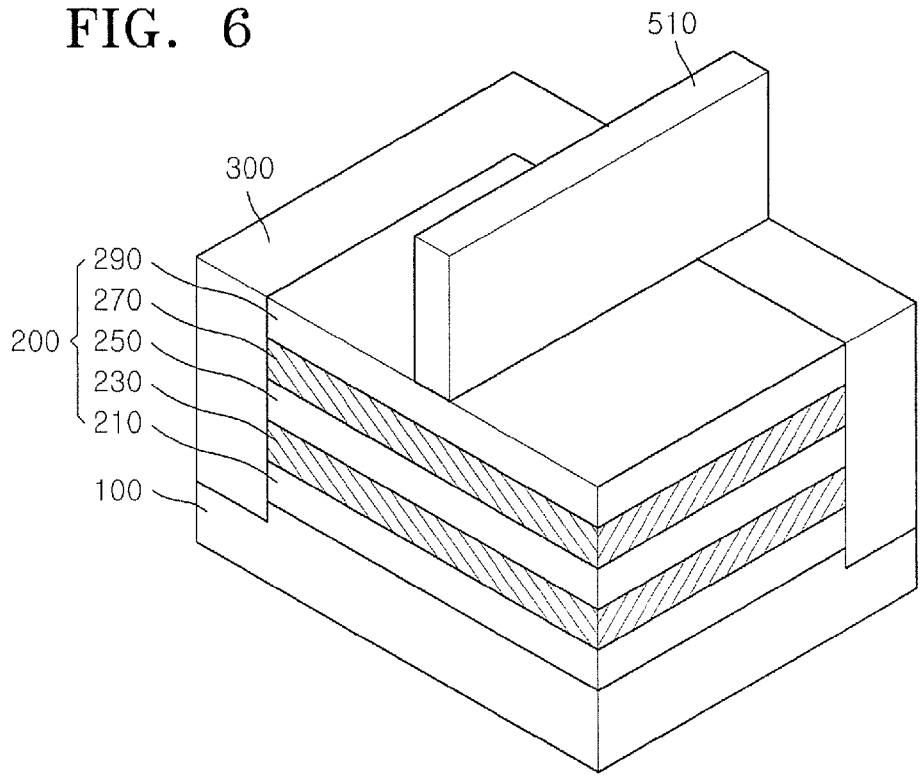
FIG. 6 is a perspective view illustrating a process of forming a dummy gate pattern on an uppermost channel layer according to some embodiments of the present invention.

FIG. 6 is a perspective view illustrating a process of forming a dummy gate pattern 510 on the third channel layer 290.

Referring to FIG. 6, the dummy gate pattern 510 is formed on the third channel layer 290. Such a dummy gate pattern 510 serves as a first mask pattern, which is a portion of a mask used when trenches (501 of FIG. 10) for the first source and drain regions 205 shown in FIGS. 3A and 3B are formed and when the first source and drain regions 205 are epitaxially grown.

Thus, to form the dummy gate pattern 510, a material having an etch selectivity with respect to the channel layers 210, 250, and 290 and the interchannel layers 230 and 270, for example, silicon oxide, may be deposited and patterned. The dummy gate pattern 510 may be formed by a plane layout for the gate 400 as shown in FIG. 3A. The dummy gate pattern 510 has substantially the same height and width as the gate 400.

Figure 7:
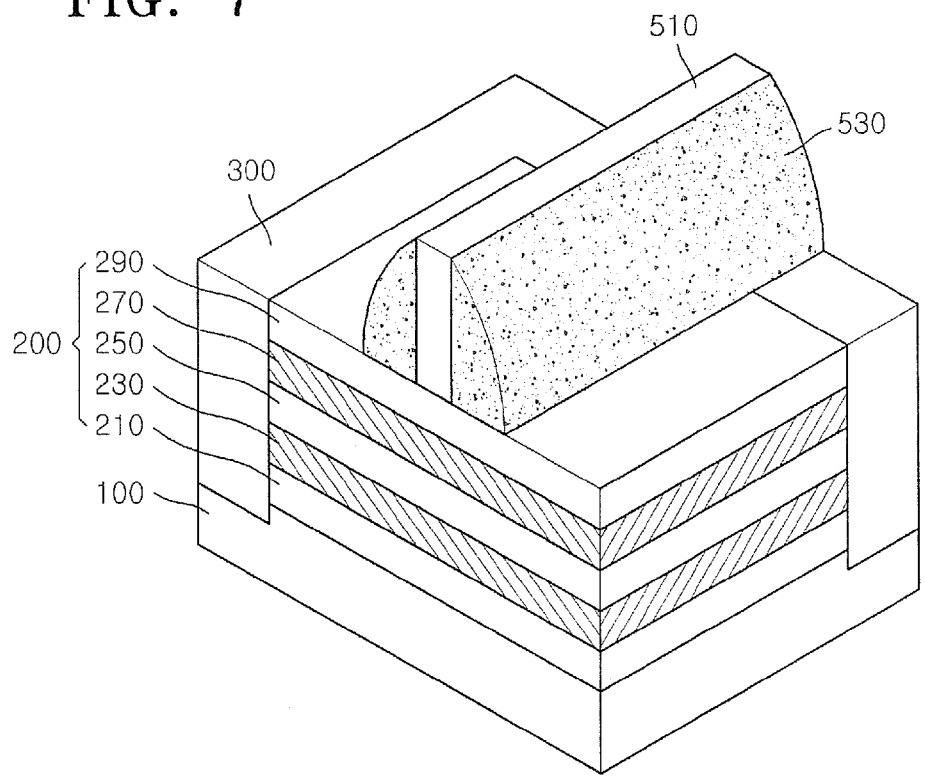
FIG. 7 is a perspective view illustrating a process of forming dummy spacers according to some embodiments of the present invention.

FIG. 7 is a perspective view illustrating a process of forming dummy spacers 530 on sides of the dummy gate pattern 510 in accordance with some embodiments of the present invention. Referring to FIG. 7, the dummy spacers 530 are formed on the sides of the dummy gate pattern 510. The width of the dummy spacers 530 determines the width of the first source and drain regions shown in FIGS. 3A and 3B and/or the width of the trenches (501 of FIG. 10) therefor. The dummy spacers 530 may be formed to the same width as that of gate spacers, which may be formed later to realize LDD-type source and drain regions on the sides of the gate 400. The dummy spacers 530 can substantially correspond to the gate spacers that will be formed on the sides of the gate 400.

Accordingly, the dummy spacers 530 serve as a second mask pattern, which 15 is used as a mask along with the dummy gate pattern 510. Because the dummy spacers 530 will be selectively removed later, they may be formed of a material having an etch selectivity with respect to the dummy gate pattern 510, for example, silicon nitride ($Si_3N_4$). The dummy spacers 530 are formed by depositing the silicon nitride and spacer-etching the same.

Figure 8:
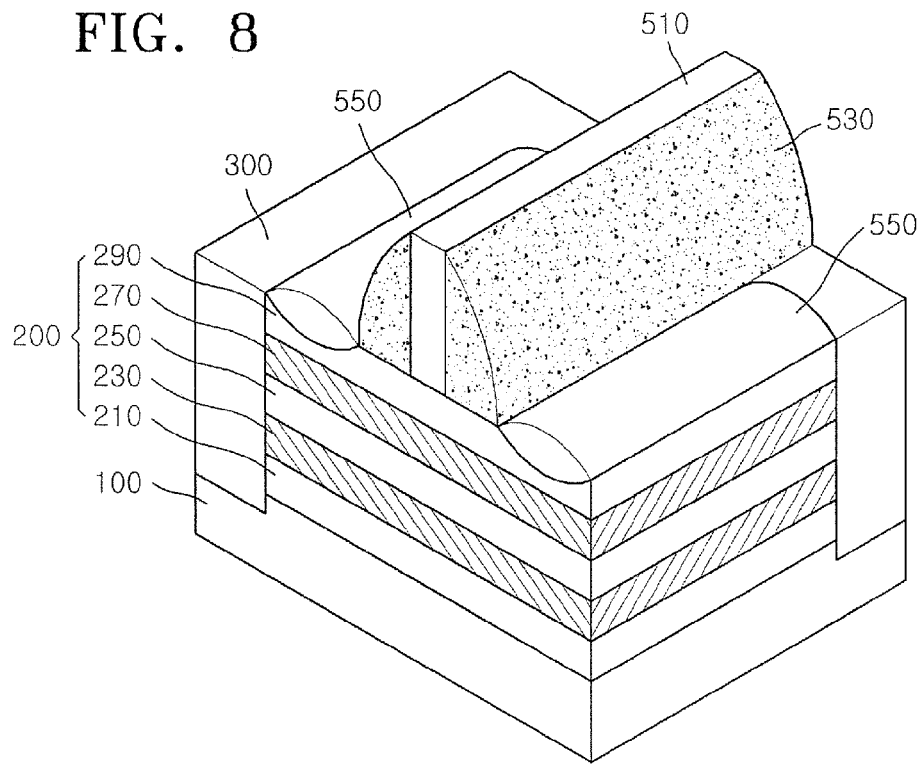
FIG. 8 is a perspective view illustrating a process of selectively oxidizing portions of the uppermost channel layer, which is exposed by the dummy spacers, according to some embodiments of the present invention.

FIG. 8 is a perspective view illustrating a process of selectively oxidizing portions of the third channel layer 290, which are exposed by the dummy spacers 530, in accordance with some embodiments of the present invention. Referring to FIG. 8, portions of the third channel layer 290, which are exposed by the dummy spacers 530, the dummy gate pattern 510, and the isolation region 300, are oxidized using an oxidation technique, thereby forming an oxide layer. The oxide layer can be understood as a third mask pattern 550, which masks layers staked thereunder during a subsequent process.

Figure 9:
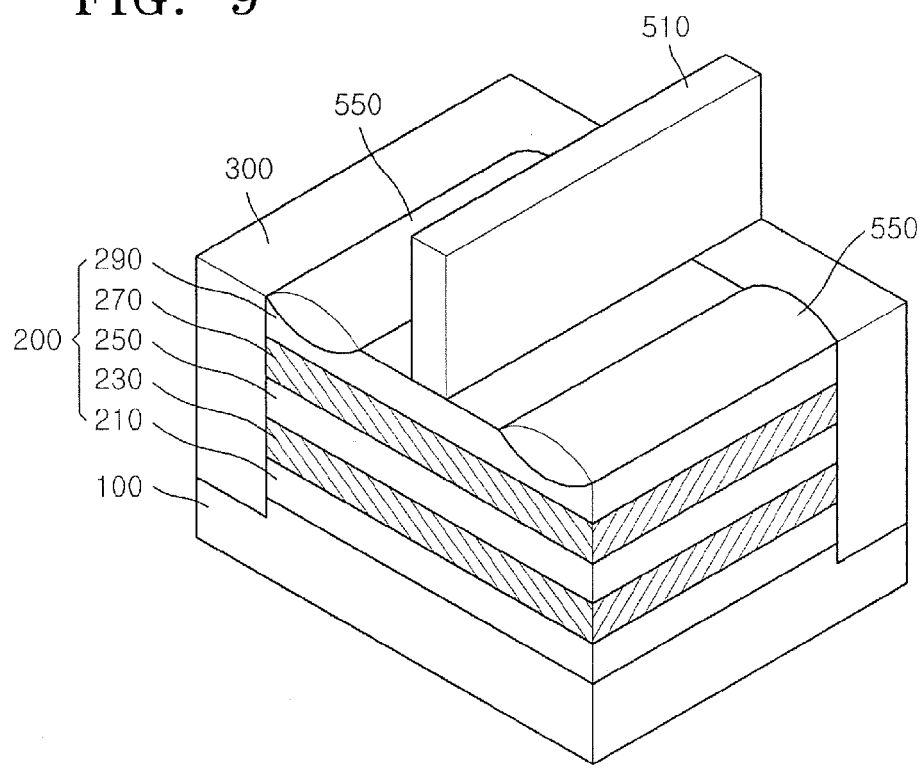
FIG. 9 is a perspective view illustrating a process of removing the dummy spacers according to some embodiments of the present invention.

FIG. 9 is a perspective view illustrating a process of removing the dummy spacers 530 in accordance with some embodiments of the present invention. Referring to FIG. 9, the dummy spacers 530 formed of silicon nitride are selectively removed with respect to the dummy gate pattern 510, the isolation region 300, and the third mask pattern 550, which are formed of silicon oxide. Thus, portions of the third channel layer 290, which are disposed under the dummy spacers 530, are exposed. In other words, regions disposed under the dummy spacers 530, i.e., the first source and drain regions (205 of FIGS. 3A and 3B), are defined by the first mask pattern (i.e., the dummy gate pattern 510) and the third mask pattern 550 and selectively exposed.

Figure 10:
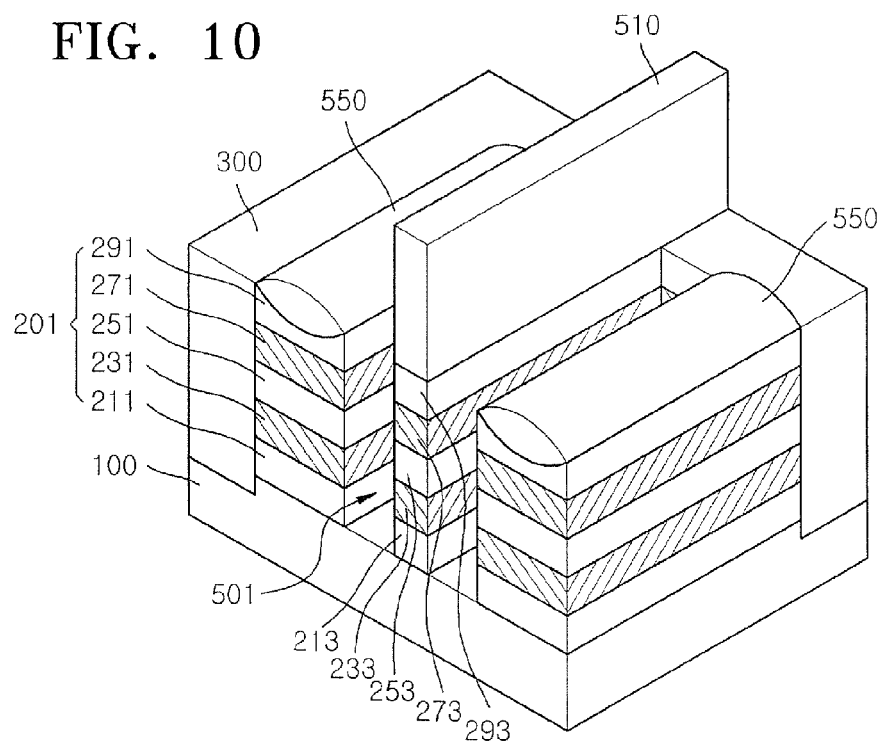
FIG. 10 is a perspective view illustrating a process of forming trenches according to some embodiments of the present invention.

FIG. 10 is a perspective view illustrating a process of forming trenches 501 in accordance with some embodiments of the present invention. Referring to FIG. 9 and FIG. 10, the portions of the third channel layer 290, which are exposed by the dummy spacers 530, and layers disposed thereunder are selectively etched and removed, thereby forming the trenches 501. In other words, the trenches 501 are formed by selectively etching regions exposed by the dummy gate pattern 510, the third mask pattern 550, and the isolation region 300. In this case, the selective etch process may continue until the lowermost first interchannel layer 230 is completely removed and the first channel layer 210 is exposed or until the substrate 100 disposed under the first channel layer 210 is exposed.

By forming the trenches 501, a stacked structure including channel patterns 213, 253, and 293 and interchannel patterns 233 and 273, which is disposed under the gate (400 of FIGS. 3A and 3B), is patterned. Also, the second source and drain regions (201 of FIGS. 3A and 3B) disposed under the third mask pattern 550 are patterned to form stacked structures including channel remaining layers 211, 251, and 291 and interchannel remaining layers 231 and 271.

Referring to FIG. 10, each of the trenches 501 exposes one lateral surface of the stacked structure including the channel patterns 213, 253, and 293 and the interchannel patterns 233 and 273, and one lateral surface of one of the stacked structures including the channel remaining layers 211, 251, and 291 and the interchannel remaining layers 231 and 271 in a lengthwise direction of the gate 400.

Figure 11:
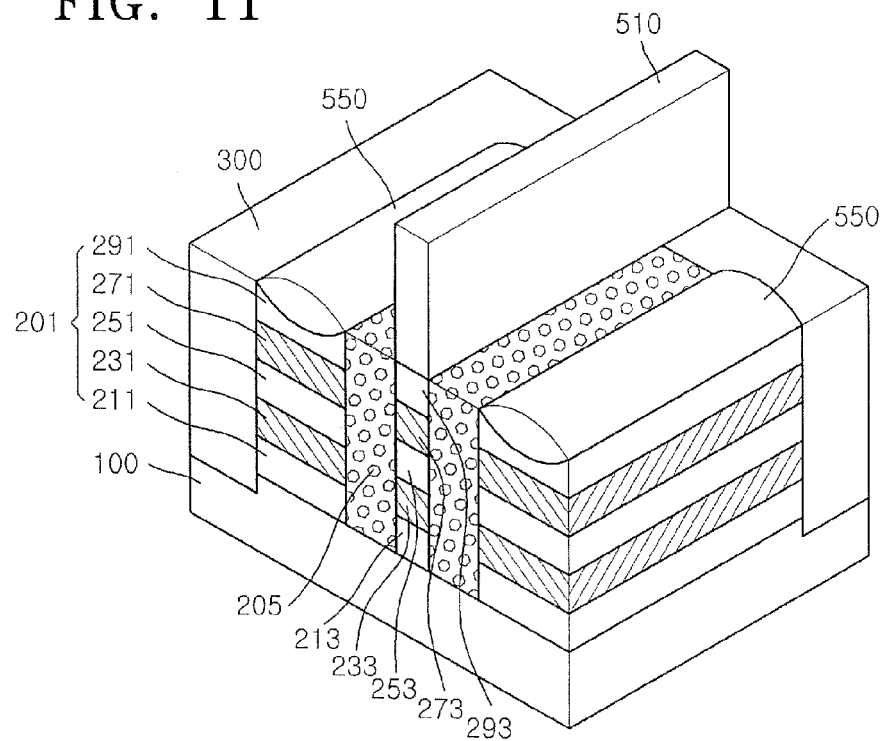
FIG. 11 is a perspective view illustrating growing first source and drain regions using selective epitaxial growth (SEG) according to some embodiments of the present invention.

FIG. 11 is a perspective view illustrating growing the first source and drain regions 205 using selective epitaxial growth (SEG) in accordance with some embodiments of the present invention. Referring to FIG. 11, the SEG is induced from the bottoms and lateral surfaces of the trenches 501, thereby forming the first source and drain regions 205 that fill the trenches 501. The first source and drain regions 205 are formed by epitaxially growing a silicon layer. Both lateral surfaces of the trenches 501 expose lateral surfaces of the channel patterns 213, 253, and 293 and the interchannel patterns 233 and 273 and lateral surfaces of the channel remaining layers 211, 251, and 291 and the interchannel remaining layers 231 and 271. Thus, both lateral surfaces of the trenches 501 are formed of Si and/or $SiGe_x$ single crystalline layers, respectively, and the bottoms of the trenches 501 are formed of a single crystalline silicon layer.

Accordingly, the SEG is induced from the Si and/or $SiGe_x$ single crystalline layers forming the lateral surfaces of the trenches 501 and the single crystalline silicon layer forming the bottoms thereof. Thus, single crystalline silicon can be grown enough to fill the trenches 501. As a result, although slightly inclined surfaces may be formed at interfaces between the lateral surfaces of the trenches 501 and the first source and drain regions 205, the first source and drain regions 205 are grown to have substantially flattened top surfaces. The first source and drain regions 205 are epitaxially grown until they form a planar surface with the third channel pattern 293.

By growing the first source and drain regions 205, the interchannel patterns 233 and 273 formed of $SiGe_x$ are surrounded by the upper and lower channel patterns 213, 253, and 293 and the first source and drain regions 205 disposed on both sides, which are formed of Si. Also, the front and rear surfaces of the interchannel patterns 233 and 273 formed of SiGe contact the lateral surfaces of the isolation region 300.

Figure 12:
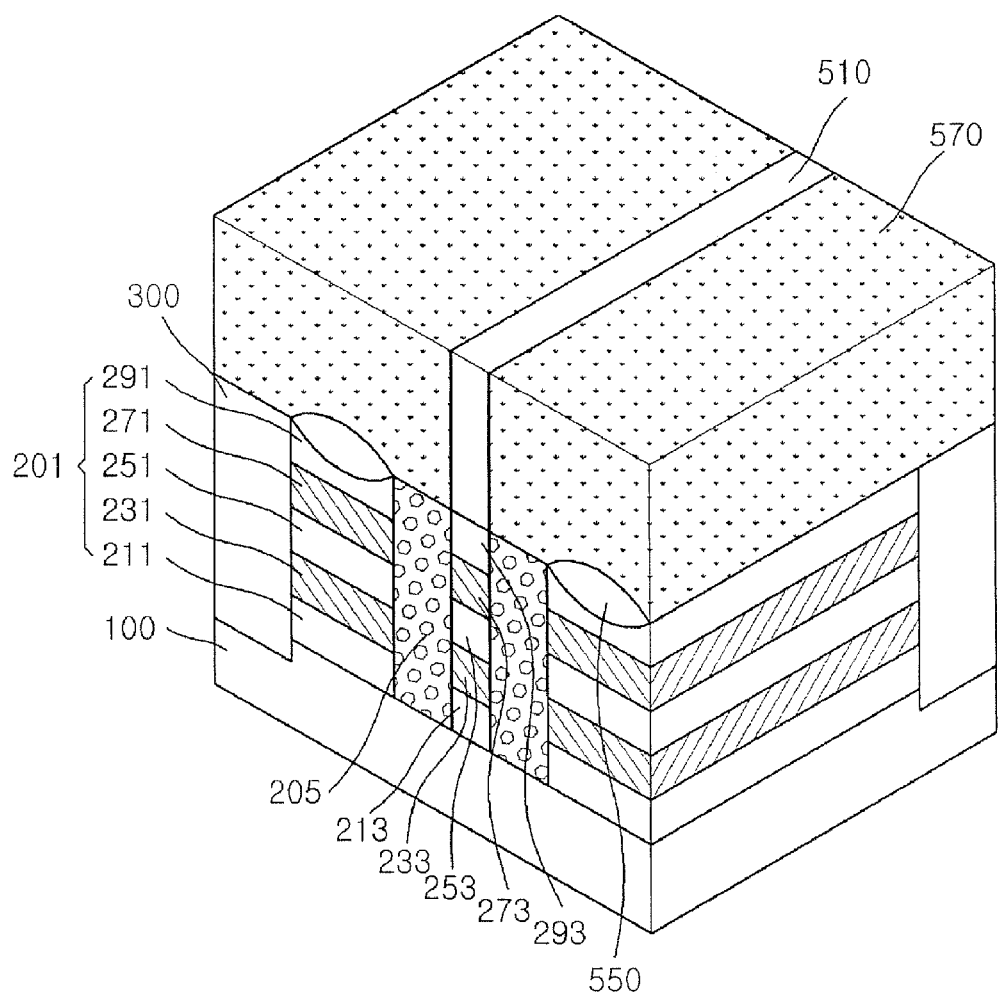
FIG. 12 is a perspective view illustrating a process of forming a mask pattern that selectively exposes the dummy gate pattern according to some embodiments of the present invention.

FIG. 12 is a perspective view illustrating a process of forming a fourth mask pattern 570 that selectively exposes the dummy gate pattern 510 in accordance with some embodiments of the present invention. Referring to FIG. 12, a material, for example, silicon nitride, which has an etch selectivity with respect to silicon oxide forming the dummy gate pattern 570 and/or the isolation region 300 and/or has an etch selectivity with respect to the material forming the channel patterns 213, 253, and 293 and/or the interchannel patterns 233 and 273, is deposited and planarized, thereby forming the fourth mask pattern 570 that exposes the top surface of the dummy gate pattern 510. Here, the planarization process may be performed using chemical mechanical polishing (CMP).

Figure 13A:
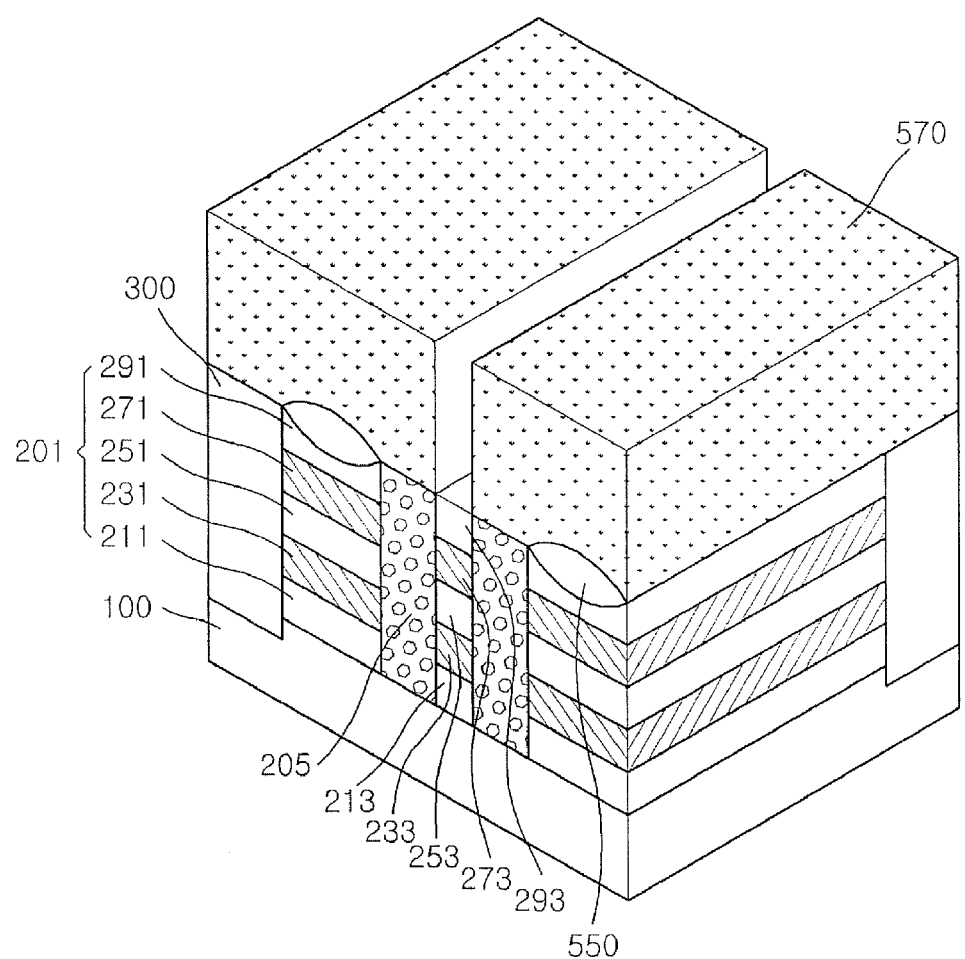
FIGS. 13A and 13B are perspective views illustrating a process of removing the dummy gate pattern and exposing the lateral surfaces of interchannel patterns according to some embodiments of the present invention.
Figure 13B:
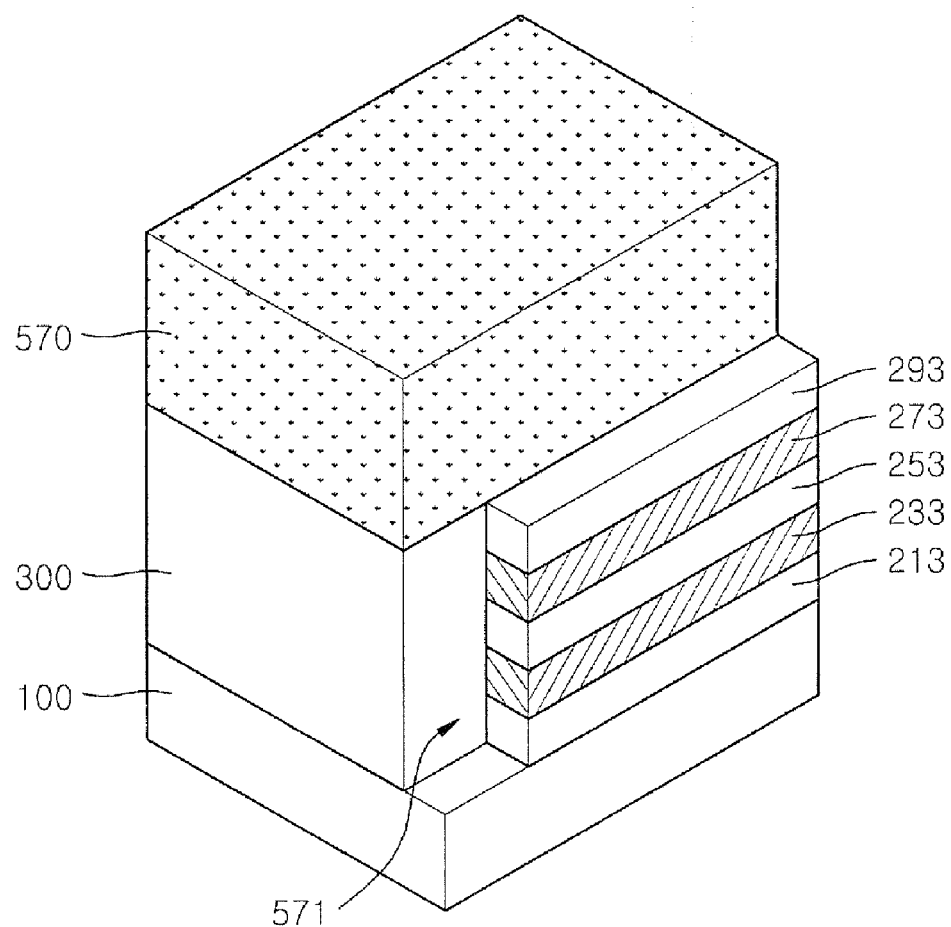

FIG. 13A is a perspective view illustrating a process of removing the dummy gate pattern 510, and FIG. 13B is a perspective view illustrating a process of selectively removing the isolation region 300 disposed under the dummy gate pattern 510 until the lateral surfaces of the interchannel patterns 233 and 273 are exposed in accordance with some embodiments of the present invention.

Referring to FIGS. 13A and 13B, the dummy gate pattern 510 exposed by the fourth mask pattern 570 is selectively removed. Thereafter, the exposed isolation region 300 is selectively removed, thereby forming grooves 571 that expose the lateral surfaces of the interchannel patterns 233 and 273. Thus, the grooves 571 expose not only the lateral surfaces of the interchannel patterns 233 and 273 but also the lateral surfaces of the channel patterns 213, 253, and 273.

Figure 14A:
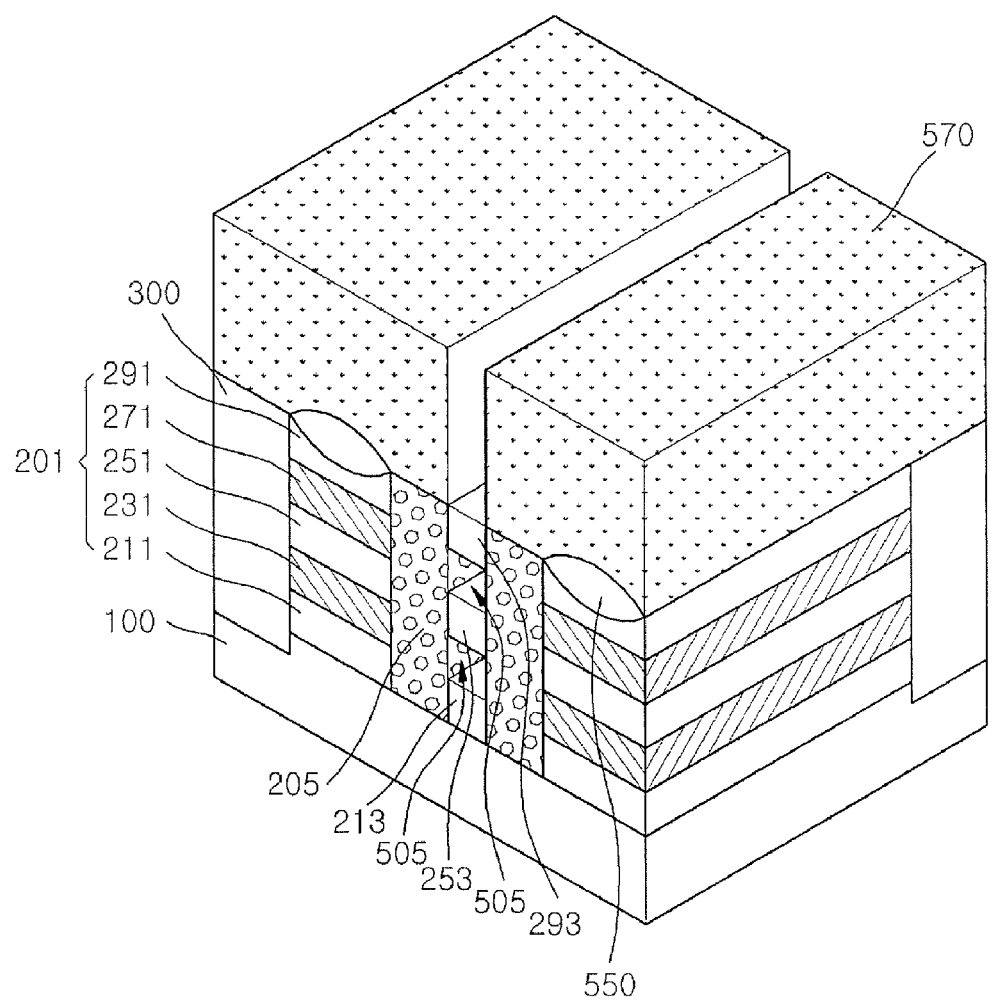
FIGS. 14A and 14B are perspective views illustrating a process of forming through tunnels according to some embodiments of the present invention.
Figure 14B:
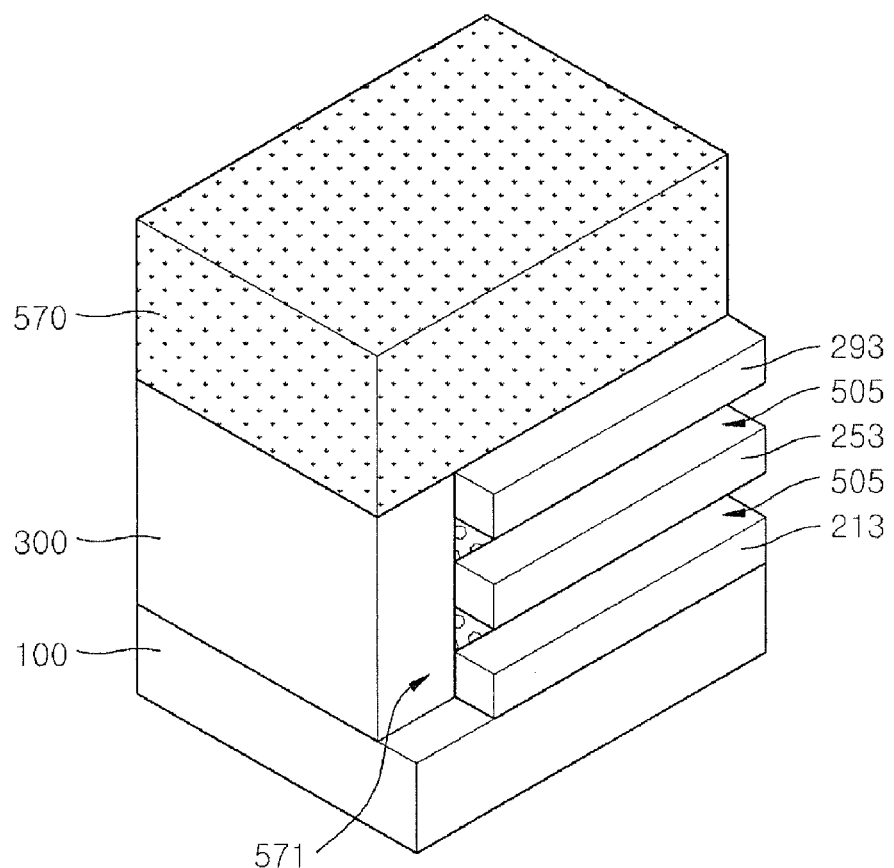

FIGS. 14A and 14B are perspective views illustrating a process of forming through tunnels 505 by selectively removing the interchannel patterns 233 and 273 in accordance with some embodiments of the present invention. Referring to FIGS. 14A and 14B, the lateral surfaces of the interchannel patterns 233 and 273, which are exposed by both the grooves 571, are selectively etched until the entire interchannel patterns 233 and 273 are removed. The interchannel patterns 233 and 273 may be formed of $SiGe_x$ and, thus, selectively etched with respect to the channel patterns 213, 253, and 293 and the first source and drain regions 205 formed of Si. As a result, the through tunnels 505, which are vacant spaces and connected to both the grooves 571, are formed.

Figure 15A:
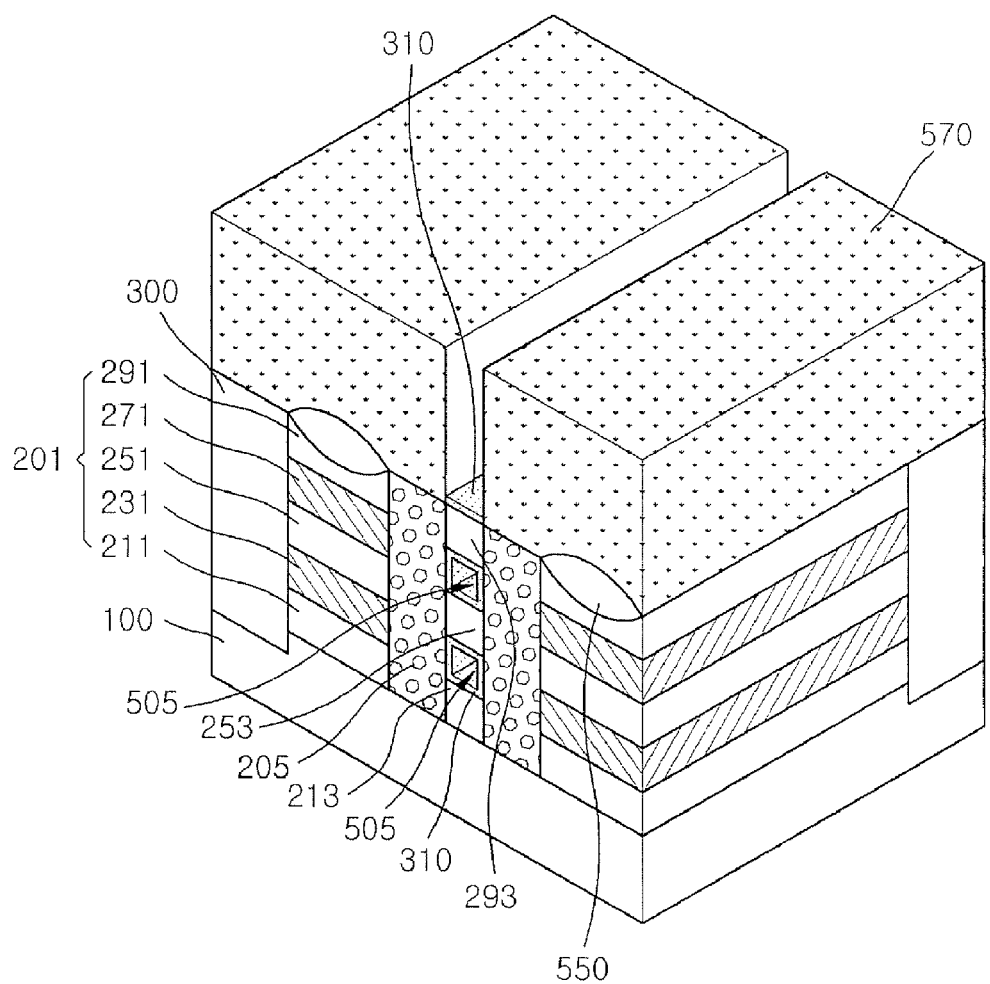
FIGS. 15A and 15B are perspective views illustrating a process of forming a gate dielectric layer according to some embodiments of the present invention.
Figure 15B:
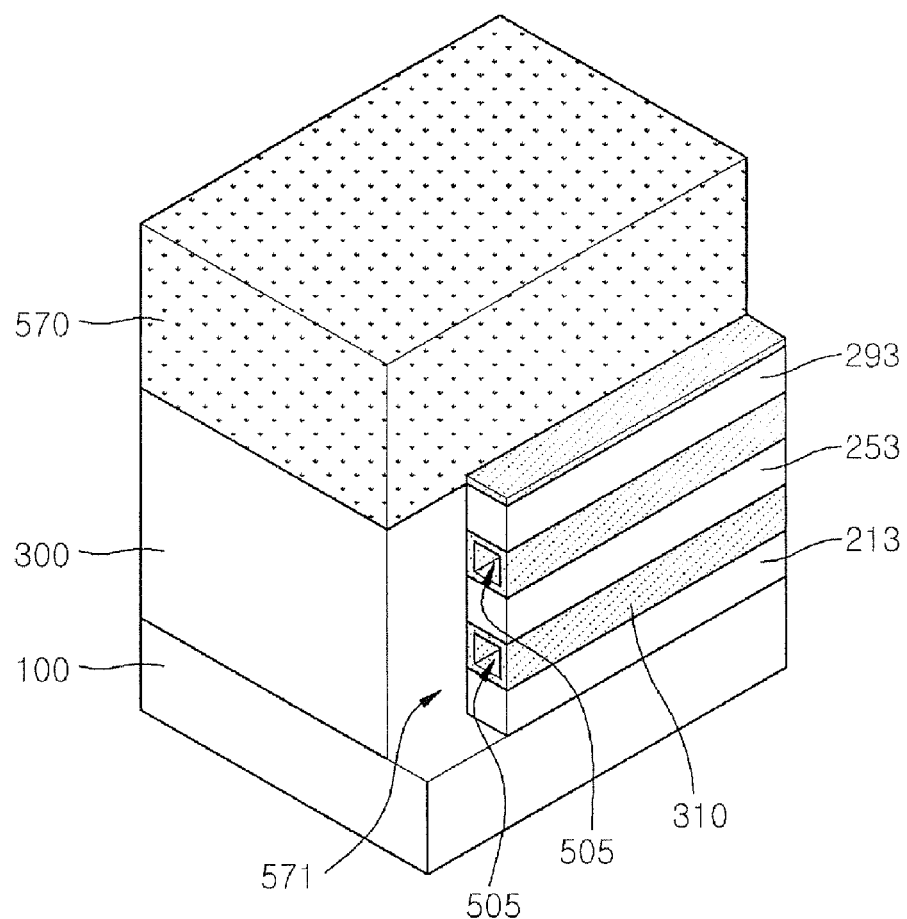

FIGS. 15A and 15B are perspective views illustrating a process of forming a gate dielectric layer 310 on the channel patterns 213, 253, and 293 in accordance with some embodiments of the present invention. Referring to FIGS. 15A and 15B, a gate dielectric layer 310 is formed using thermal oxidation or chemical vapor deposition (CVD) on the exposed surfaces of the channel patterns 213, 253, and 293 and the sidewalls of the first source and drain regions 205 exposed by the through tunnels 505. Thus, the sidewalls of the through tunnels 505 are wholly covered by the gate dielectric layer 310. Also, the top surface of the uppermost third channel pattern 293 exposed by the fourth mask pattern 570 is also covered by the gate dielectric layer 310. Further, the gate dielectric layer 310 also covers the lateral surfaces of the channel patterns 213, 253, and 293, which are exposed by the grooves 571.

Figure 16A:
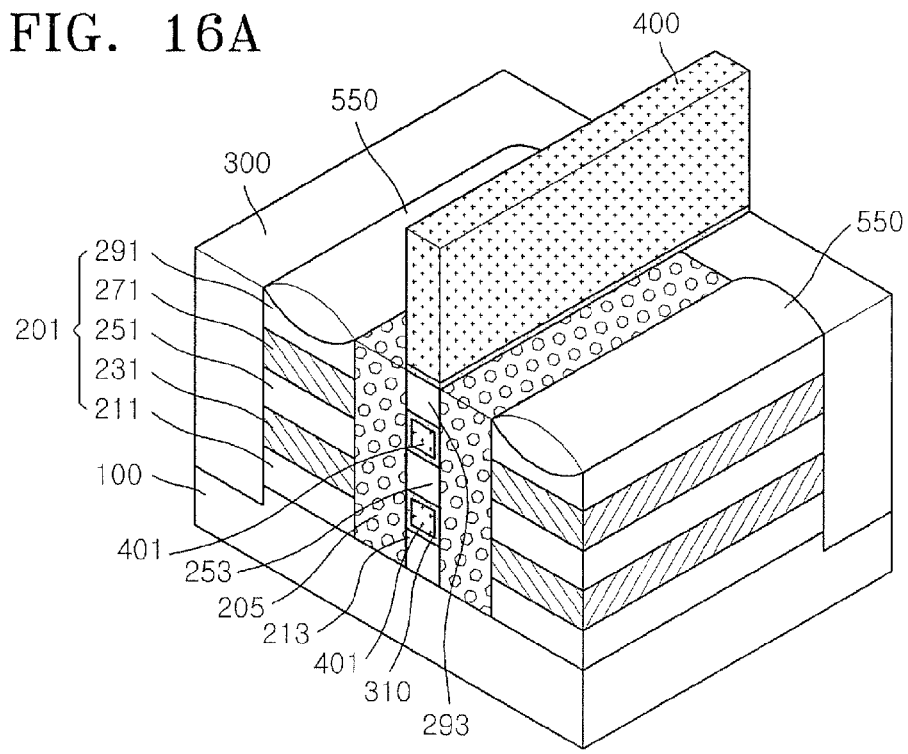
FIGS. 16A and 16B are perspective views illustrating a process of forming a gate according to some embodiments of the present invention.
Figure 16B:
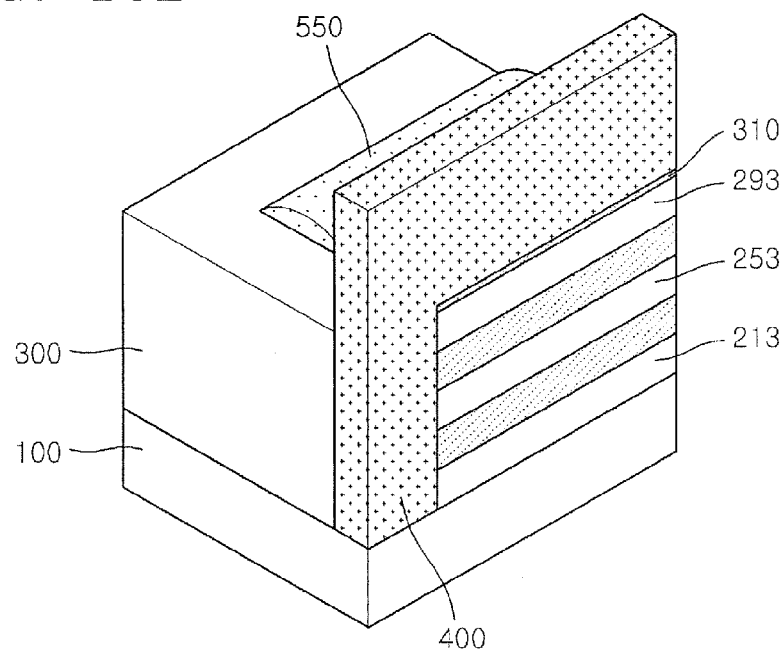

FIGS. 16A and 16B are perspective views illustrating a process of forming the gate 400 and gate branch layers 401 in accordance with some embodiments of the present invention. Referring to FIGS. 16A and 16B, a conductive layer, for example, a conductive polysilicon layer, is deposited on the gate dielectric layer 310 and planarized using CMP, thereby forming the gate 400 on the uppermost third channel pattern 293. That is, the gate 400 is patterned using the fourth mask pattern 570 without using any additional photolithography and etching processes.

Meanwhile, during the deposition of conductive polysilicon, the through tunnels 505 are filled with the gate branch layers 401, which extend from the gate 400. The gate branch layers 401 are electrically connected to portions of the gate 400, which extend vertically to fill the grooves 571.

Thereafter, the fourth mask pattern 570 is selectively removed. Thus, the top surfaces of the first source and drain regions 205 adjacent to the gate 400 are exposed. Also, the third mask pattern 530 is selectively removed until the surfaces of the second source and drain regions 201 are exposed. The second source and drain regions 201 are maintained on substantially the same plane with the first source and drain regions 205. Thus, when a contact position is defined on the surfaces of the second source and drain regions 201, a distance between the contact position and the gate 400 can be reduced and/or minimized, thus reducing source and drain resistances.

After the MBCFET according some embodiments of the present invention is formed, a metallization, for example, a metal silicidation may be performed to reduce the resistances of the gate 400 and/or the source and drain regions 205 and 201.

Figure 17:
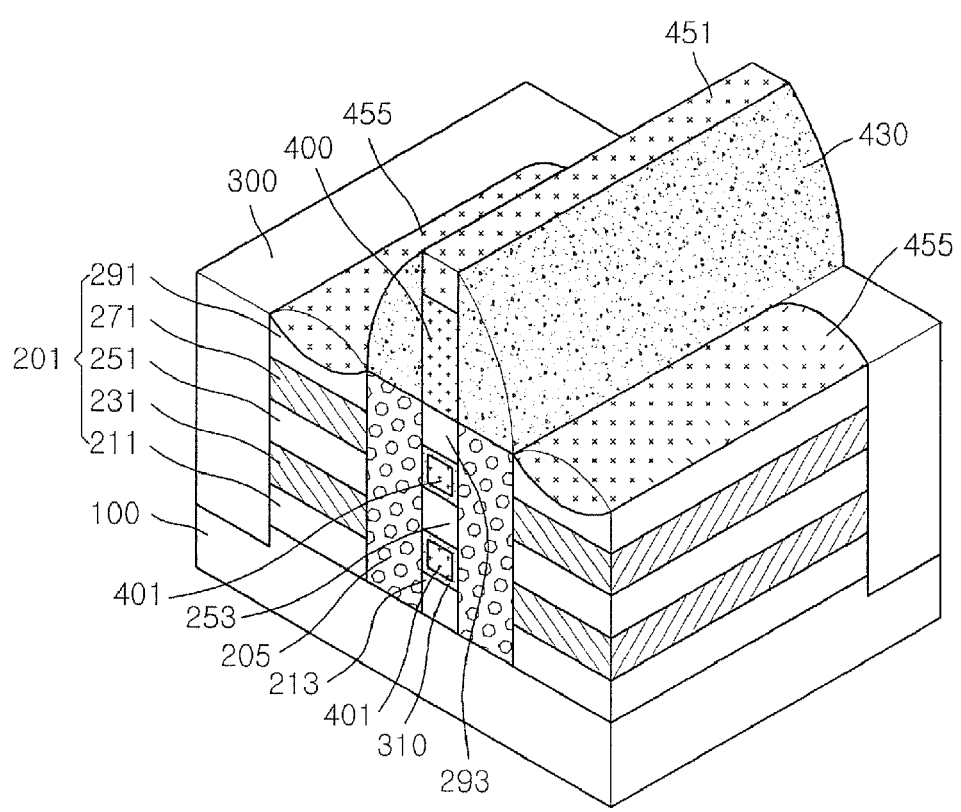
FIG. 17 is a perspective view illustrating a process of forming metal silicide layers according to some embodiments of the present invention.

FIG. 17 is a perspective view illustrating a process of forming a first metal silicide layer 451 and a second metal silicide layer 455 in accordance with some embodiments of the present invention. Referring to FIG. 17, gate spacers 430 are formed on the sidewalls of the gate 400, and a metal layer is deposited and silicided. Thereafter, a nonreacted portion of the metal layer is selectively removed. Thus, the first metal silicide layer 451 may be formed on the gate 400, and the second metal silicide layer 455 may be formed on the second source and drain regions 201 exposed by the gate spacers 430.

Before the metallization, impurities are implanted into the first source and drain regions 205 and the second source and drain regions 201, thereby forming source and drain junctions. In this case, the source and drain junctions can have LDD structures. For instance, impurity ions are implanted into the first source and drain regions 205 and the second source and drain regions 201 using the gate 400 as a mask so that lightly doped layers, e.g., LDD layers, are formed. After the gate spacers 430 are formed on the sidewalls of the gate 400, heavily doped layers are formed to a greater depth than the LDD layers, thereby completing the source and drain junctions.

Although not shown in the drawings, the source and drain junctions may diffuse into at least the substrate 100 disposed under the first channel remaining layer 211. In particular, a lower doping layer of LDD-type source and drain junctions may diffuse throughout the entire first source and drain regions 205. After the source and drain junctions are formed, the metallization may be performed.

As described above, source and drain regions can be formed on the same plane with an uppermost channel layer disposed directly under an uppermost gate in accordance with some embodiments of the present invention. Thus, a MBCFET, according to some embodiments of the present invention, can include flattened source and drain regions. As a result, resistance of the source and drain regions can be reduced, and a metallization, such as a metal silicidation, can be effectively performed. Methods, according to some embodiments of the present invention, can be applied to a bulk silicon substrate or an SOI substrate in the same manner.

In concluding the detailed description, it should be noted that many variations and modifications can be made to the embodiments without substantially departing from the principles of the present invention. All such variations and modifications are intended to be included herein within the scope of the present invention, as set forth in the following claims.

That which is claimed:

1. A method of forming a multi-bridge-channel metal oxide semiconductor field effect transistor (MOSFET), comprising:
    forming a stacked structure on a substrate, the stacked structure comprising channel layers and interchannel layers interposed between the channel layers;
    forming trenches by selectively etching the stacked structure, the trenches running across the stacked structure parallel to each other and separating a first stacked portion comprising channel patterns and interchannel patterns from second stacked portions comprising channel layers and interchannel layers remaining on both sides of the first stacked portion;
    growing first source and drain regions using selective epitaxial growth, the first source and drain regions filling the trenches and being connected to second source and drain regions defined by the second stacked portions;
    selectively exposing marginal sections of the interchannel patterns of the first stacked portion;

forming through tunnels by selectively removing the interchannel patterns of the first stacked portion beginning with the exposed marginal sections, the through tunnels being surrounded by the first source and drain regions and the channel patterns; and forming a gate along with a gate dielectric layer, the gate filling the through tunnels and extending onto the first stacked portion.

2. The method of claim 1, wherein the substrate comprises a silicon substrate and a silicon on insulator (SOI) substrate.

3. The method of claim 1, wherein the channel layers and the interchannel layers comprise single crystalline semiconductor materials, respectively, having an etch selectivity with respect to each other.

4. The method of claim 3, wherein the first source and drain regions have an etch selectivity with respect to the interchannel layers.

5. The method of claim 4, wherein forming the stacked structure comprises:

forming the channel layers by epitaxially growing a silicon layer;

forming the interchannel layers by epitaxially growing a silicon germanium layer; and forming the first source and drain regions by growing a silicon layer using selective epitaxial growth.

6. The method of claim 1, wherein the trenches are spaced apart from each other such that the first stacked portion has about a same width as a width of a portion of the gate that extends onto the first stacked portion.

7. The method of claim 1, wherein the first source and drain regions have about a same height as a top surface of the first stacked portion.

8. The method of claim 1, further comprising:

forming gate spacers on sidewalls of a portion of the gate that extends onto the first stacked portion;

wherein the trenches have about a same width as that of the gate spacers.

9. The method of claim 8, further comprising:

selectively forming a metal silicide layer on portions of the gate that are exposed by the gate spacers and surfaces of the second source and drain regions.

10. The method of claim 1, wherein the gate dielectric layer is formed between the gate and the channel patterns and between the gate and the first source and drain regions.

11. A method of forming a multi-bridge-channel FET (MBCFET), comprising:

forming a stacked structure on a substrate, the stacked structure comprising channel layers and interchannel layers interposed between the channel layers;

forming an isolation region defining the stacked structure;

forming a dummy gate pattern on the stacked structure;

forming dummy spacers on sides of the dummy gate pattern;

forming a first mask pattern by oxidizing a surface of the stacked structure exposed by the dummy spacers;

selectively removing the dummy spacers;

forming trenches by selectively removing exposed portions of the stacked structure using the dummy gate pattern and the first mask pattern as an etch mask, the trenches separating a first stacked portion comprising channel patterns and interchannel patterns from second stacked portions comprising channel layers and interchannel layers remaining on both sides of the first stacked portion;

growing first source and drain regions using selective epitaxial growth, the first source and drain regions filling the trenches and being connected to second source and drain regions defined by the second stacked portions;

forming second mask patterns on sides of the dummy gate patterns;

exposing marginal sections of the interchannel patterns of the first stacked portion by selectively removing the dummy gate pattern using the second mask pattern as an etch mask and selectively removing a portion of the isolation region that is exposed under the dummy gate pattern;

forming through tunnels by selectively removing the interchannel patterns of the first stacked portion beginning with the exposed marginal sections, the through tunnels being surrounded by the first source and drain regions and the channel patterns; and forming a gate along with a gate dielectric layer, the gate filling the through tunnels and extending onto the first stacked portion.

12. The method of claim 11, wherein the channel layers and the interchannel layers comprise single crystalline semiconductor materials, respectively, having an etch selectivity with respect to each other.

13. The method of claim 12, wherein the first source and drain regions have an etch selectivity with respect to the interchannel layers.

14. The method of claim 13, wherein forming the stacked structure comprises:

forming the channel layers by epitaxially growing a silicon layer;

forming the interchannel layers by epitaxially growing a silicon germanium layer; and forming the first source and drain regions by growing a silicon layer using selective epitaxial growth.

15. The method of claim 11, wherein the dummy gate pattern comprises silicon oxide.

16. The method of claim 11, wherein the dummy spacers comprise silicon nitride.

17. The method of claim 11, wherein the first source and drain regions have about a same height as a top surface of the first stacked portion.

18. The method of claim 11, wherein forming the second mask patterns comprises:

forming a silicon nitride layer to cover the first source and drain regions; and planarizing the silicon nitride layer until a top surface of the dummy gate pattern is exposed.

19. The method of claim 11, further comprising:

selectively removing the second mask patterns;

selectively removing the first mask pattern;

forming gate spacers on sidewalls of a portion of the gate that extends onto the first stacked portion; and selectively forming a metal suicide layer on the portion of the gate and the second source and drain regions that are exposed by the gate spacers.

20. The method of claim 11, wherein the gate dielectric layer extends between the gate and the channel patterns of the first stacked portion and between the gate and the first source and drain regions.

* * * * *